(12) United States Patent
Guo et al.

(10) Patent No.: US 11,453,795 B2
(45) Date of Patent: Sep. 27, 2022

(54) INK FORMULATION, OPTOELECTRONIC DEVICES, AND PREPARATION METHODS OF FUNCTIONAL LAYER OF OPTOELECTRONIC DEVICES

(71) Applicant: Najing Technology Corporation Limited, Zhejiang (CN)

(72) Inventors: Haitao Guo, Zhejiang (CN); Junjun Peng, Zhejiang (CN); Changgua Zhen, Zhejiang (CN)

(73) Assignee: Najing Technology Corporation Limited, Zhejiang (CN)

( * ) Notice: Subject to any disclaimer, the term of this patent is extended or adjusted under 35 U.S.C. 154(b) by 438 days.

(21) Appl. No.: 16/479,614

(22) PCT Filed: Feb. 2, 2018

(86) PCT No.: PCT/CN2018/075010
§ 371 (c)(1),
(2) Date: Jul. 22, 2019

(87) PCT Pub. No.: WO2018/149305
PCT Pub. Date: Aug. 23, 2018

(65) Prior Publication Data
US 2021/0355337 A1    Nov. 18, 2021

(30) Foreign Application Priority Data

Feb. 17, 2017  (CN) .......................... 201710088547.5
Apr. 11, 2017  (CN) .......................... 201710233555.4

(51) Int. Cl.
*C09D 11/50* (2014.01)
*H01L 51/00* (2006.01)
(Continued)

(52) U.S. Cl.
CPC .......... *C09D 11/50* (2013.01); *H01L 51/0005* (2013.01); *H01L 51/0007* (2013.01);
(Continued)

(58) Field of Classification Search
CPC ............. H01L 51/0005; H01L 51/0007; H01L 51/502; C09D 11/54
See application file for complete search history.

(56) References Cited

U.S. PATENT DOCUMENTS

2004/0109051 A1* 6/2004 Bright .................... C09D 11/36
252/301.16
2005/0136349 A1* 6/2005 Mishra ................. G03G 5/0525
430/58.65
(Continued)

FOREIGN PATENT DOCUMENTS

| CN | 1950959 A | 4/2007 |
|---|---|---|
| CN | 101796621 A | 8/2010 |

(Continued)

OTHER PUBLICATIONS

Corresponding JP search report dated Sep. 8, 2020.

*Primary Examiner* — Robert A Vetere
(74) *Attorney, Agent, or Firm* — Gang Yu (57) ABSTRACT

The present application relates to an ink formulation, and preparation methods of functional layer of optoelectronic devices. The ink formulation includes a component A and a component B, the component A including a first liquid, the component B including a second liquid and a functional material dispersed in the second liquid, the first liquid having a boiling point at least 10° C. higher than a boiling point of the second liquid; the first liquid and the second liquid are immiscible and the solubility of the functional material in the second liquid is ≥1 g, the solubility of the functional material in the first liquid is ≤0.05 g, the density of the first liquid is greater than the density of the second (Continued)

liquid, and the ratio of the surface tension of the first liquid to the surface tension of the second liquid ranges from 0.8 to 1.2.

19 Claims, 1 Drawing Sheet

(51) Int. Cl.
*B82Y 20/00* (2011.01)
*B82Y 40/00* (2011.01)
*H01L 51/50* (2006.01)
*H01L 51/56* (2006.01)

(52) U.S. Cl.
CPC ............... *B82Y 20/00* (2013.01); *B82Y 40/00* (2013.01); *H01L 51/502* (2013.01); *H01L 51/5016* (2013.01); *H01L 51/56* (2013.01)

(56) References Cited

U.S. PATENT DOCUMENTS

| | | | | |
|---|---|---|---|---|
| 2007/0054981 A1* | 3/2007 | Yanagi | ................... | C09D 11/40 523/160 |
| 2009/0101206 A1* | 4/2009 | Diklich | ................. | H01L 51/441 136/247 |
| 2013/0149811 A1* | 6/2013 | Hasegawa | ............ | C09D 11/322 438/99 |
| 2014/0138655 A1 | 5/2014 | Sonoyama et al. | | |

FOREIGN PATENT DOCUMENTS

| | | | |
|---|---|---|---|
| CN | 103069555 A | 4/2013 | |
| CN | 105428546 A | 3/2016 | |
| CN | 107177239 A | 9/2017 | |
| CN | 107400414 A | 11/2017 | |
| GB | 2466842 A | 7/2010 | |
| JP | 2004014172 A | 1/2004 | |
| JP | 2004532096 A | 10/2004 | |
| JP | 2007123580 A | 5/2007 | |
| JP | 2007527624 A | 9/2007 | |
| JP | 2009266824 A | 11/2009 | |
| JP | 2010161070 A | 7/2010 | |
| JP | 2010209141 A | 9/2010 | |
| JP | 2014077046 A | 5/2014 | |
| JP | 2015173210 A | 10/2015 | |
| WO | 2012018082 A | 2/2012 | |
| WO | 2014181245 A | 11/2014 | |
| WO | WO-2014181245 A1 * | 11/2014 | ......... A61K 49/0067 |
| WO | 2016143451 A1 | 9/2017 | |

* cited by examiner

INK FORMULATION, OPTOELECTRONIC DEVICES, AND PREPARATION METHODS OF FUNCTIONAL LAYER OF OPTOELECTRONIC DEVICES

CROSS REFERENCE TO RELATED APPLICATIONS

This application is a national application of PCT/CN2018075010, filed on Feb. 2, 2018. The contents of PCT/CN2018075010 are all hereby incorporated by reference.

TECHNICAL FIELD

The disclosure relates to the field of luminescent material solution, and in particular to an ink formulation, optoelectronic devices, and preparation methods of functional layers of optoelectronic devices.

BACKGROUND

The occurrence of coffee ring phenomenon or the accumulation of ink in the middle when preparing a luminescent device by solution printing causes the film layer to be uneven, thereby making the light emission uneven.

In the prior art, there is a preparation method of organic luminescent material solution for improving the uniformity of an ink-jet printing film by using convection, wherein the solution includes two solvents, the first solvent is chlorobenzene, and the second solvent is cumene, both with a boiling point of less than 160° C. and a viscosity of less than 1 cps, not only affecting the quality of the ink ejected from the nozzle, but also causing a fast solvent drying rate to affect the uniformity of the film layer.

A quantum dot ink formulation has been disclosed, using a mixed solvent system of an alkane and a small molecule alcohol, in which the alkane has a higher boiling point than the alcohol, and the purpose of adding the small molecule alcohol solvent is to adjust the ink formulation so as to be used in the ink-jet printing process, but without really solving the problem of the coffee ring.

Therefore, there is still a need to improve the prior art to solve the problem of uneven film layer by using the existing solution method for film formation.

SUMMARY

The main object of the present disclosure is to provide an ink formulation, and preparation methods of functional layer of optoelectronic devices, so as to solve the problem of uneven film layer when the solution methods in the prior art are used for film formation.

To achieve the aforesaid objective, according to one aspect of the present disclosure, there is provided an ink formulation which includes a component A and a component B, the component A including a first liquid, the component B including a second liquid and a functional material dispersed in the second liquid, the first liquid having a boiling point at least 10° C. higher than a boiling point of the second liquid; the first liquid and the second liquid are immiscible, the solubility of the functional material in the second liquid is more than or equal to 1 g, the solubility of the functional material in the first liquid is less than or equal to 0.05 g, the density of the first liquid is greater than the density of the second liquid, and the ratio of the surface tension of the first liquid to the surface tension of the second liquid is 0.8 to 1.2.

Further, the ratio of the surface tension of the first liquid to the surface tension of the second liquid is 0.9 to 1.1, preferably, the ratio of the surface tension of the first liquid to the surface tension of the second liquid is equal to 1.

Further, the functional material has a solubility in the second liquid of 2 g or more, and the functional material has a solubility in the first liquid of less than 0.01 g.

Further, the first liquid has a boiling point, at least 20° C. higher than, more preferably at least 30° C. higher than, a boiling point of the second liquid.

Further, the functional material is selected from any one of an electron injection material, an electron transport material, a hole injection material, a hole transport material and a luminescent material.

Further, the first liquid or the second liquid is selected from one or more of an aliphatic hydrocarbon, an aromatic hydrocarbons, a monohydric alcohol, a polyhydric alcohol, a ketone, an ester, an ether, an alcohol ether and water.

Further, in the component B, the functional material has a solid content of 1 mg/mL to 200 mg/mL.

Further, the functional material is a luminescent material, the luminescent material being a luminescent nanocrystal, and the first liquid is selected from one or more of an alcohol and an ester, preferably, the alcohol is a monohydric alcohol or a polyhydric alcohol having a carbon number of less than 18; more preferably, the alcohol is a monohydric alcohol having a carbon number of less than 18 and greater than or equal to 6 or a polyhydric alcohol having a carbon number of less than 18 and greater than or equal to 2.

Further, the second liquid includes any one or more of an aliphatic hydrocarbon and/or an aromatic hydrocarbon, and the second liquid has a boiling point of 170 to 300° C., and the second liquid preferably includes an aromatic hydrocarbon having a carbon number of 9 to 18 and/or an alkane having a carbon number of 10 to 18, and more preferably an aromatic hydrocarbon having a carbon number of 10 to 18.

Further, the second liquid further includes a function regulator, the functional regulator being selected from an alcohol, a ketone or an ester, and preferably the volume percentage of the functional regulator in the second liquid is 10% to 50%.

Further, the volume percentage of the alkane in the second liquid is ≥30%, and preferably ≥50%.

Further, in the component B, the luminescent nanocrystal has a solid content of 20 mg/mL to 200 mg/mL Further, the luminescent nanocrystal has a surface ligand, the surface ligand being selected from one or more of a carboxylic acid, an alkyl mercaptan, an amine, an alkyl phosphine and an alkylphosphine oxide.

Further, the component A has a surface tension of 30 to 45 dyn/cm.

Further, the component B has a surface tension of 25 to 40 dyn/cm.

Further, the volume ratio of the component A to the component B is 1:1 to 10:1.

According to a further aspect of the present disclosure, there is provided a method for preparing the functional layer of an optoelectronic device, in which the preparation method includes: disposing a component A as a first preliminary layer; disposing a component B on the first preliminary layer to form a second preliminary layer to obtain a preform; drying the preform to obtain the functional layer of optoelectronic device; in which, the component A and the component B are the component A and the component B in any one aforesaid ink formulation.

Further, the first preliminary layer and/or the second preliminary layer are disposed in a manner of ink-jet printing, slit coating or spray coating.

According to a further aspect of the present disclosure, there is provided a method for preparing an optoelectronic device, and the preparation method of the optoelectronic device including preparation steps of functional layers, in which the preparation steps of functional layers include: disposing a component A as a first preliminary layer; disposing a component B on the first preliminary layer to form a second preliminary layer; disposing a component C on the second preliminary layer to form a third preliminary layer to obtain a preform; drying the preform to obtain two adjacent functional layers; in which, the first preliminary layer and the second preliminary layer subjected to drying form a functional layer, and the third preliminary layer subjected to drying forms another functional layer, the component A and the component B are the component A and the component B in any one aforesaid ink formulation; the liquid density in the component C is smaller than the liquid density in the component B; the liquid in the component C is immiscible with the liquid in the component B; the solubility of the functional material of the component C in the liquid of the component B is 0.05 g or less; and the ratio of the surface tension of the liquid in the component C to the surface tension of the liquid in the component B is 0.8 to 1.2.

According to a further aspect of the present disclosure, there is provided a method for preparing another optoelectronic device including preparation steps of functional layers, and the preparation steps of functional layers include: disposing a component A1 as a first preliminary layer; disposing a component B1 on the first preliminary layer to form a second preliminary layer; disposing a component A2 on the second preliminary layer to form a third preliminary layer; the third preliminary layer is adjacent to the second preliminary layer; disposing a component B2 on the third preliminary layer to form a fourth preliminary layer to obtain the preform; drying the preform to obtain two functional layers; in which, the first preliminary layer and the second preliminary layer subjected to drying form a functional layer; the third preliminary layer and the fourth preliminary layer subjected to drying form another functional layer; the component A1 and the component B1 are the component A and the component B in any one aforesaid ink formulation; the component A2 and the component B2 are the component A and the component B in any one aforesaid ink formulation, and the liquid density in the component A2 is less than the liquid density in the component B1, and the liquid in the component A2 is immiscible with the liquid in the component B1; the solubility of the functional material of the component B1 in the liquid of the component A2 is 0.05 g or less; and the ratio of the surface tension of the liquid in the component A2 to the surface tension of the liquid in the component B1 is 0.8 to 1.2.

According to a further aspect of the present disclosure, there is provided an optoelectronic device including a substrate and a first electrode layer and a second electrode layer sequentially disposed on the substrate, in which there is provided a functional layer between the first electrode layer and the second electrode layer, the functional layer being prepared by any one aforesaid preparation method; or the optoelectronic device being prepared by any one aforesaid preparation method of optoelectronic device.

Further, the optoelectronic device is an electroluminescent device, and the substrate is a conductive substrate having a pixel isolation structure.

According to the technical solution of the present disclosure, due to a lower boiling point, the second liquid in the component B volatilizes earlier than the first liquid in the component A, and as the second liquid volatilizes, a first interface is formed between the component B and the external atmosphere, and a second interface is formed between the component B and the component A. Since the surface tension of the first liquid is relatively close to the surface tension of the second liquid, the first interface and the second interface are nearly parallel or completely parallel. As the second liquid volatilizes, the functional material gradually precipitates and settles, and is homogeneously distributed at the second interface. Since the solubility of the settled functional material in the first liquid is extremely low, it is difficult for the first liquid to drive the functional material to the edge during the volatilization process, and then, with the gradual evaporation of the first liquid, the functional material uniformly dispersed at the interface forms a uniform film on the substrate, which solves the problem of uneven film formation.

DETAILED DESCRIPTION

It should be noted that the embodiments in the present application and the features in the embodiments can be combined with each other without conflict. The present disclosure will be described in detail below with reference to the accompanying figures and in conjunction with the embodiments.

In the present disclosure, the functional material refers to a functional material for forming an OLED device or a QLED device; the solubility of the functional material in a liquid means that the mass (g) of dissolved solute when a solid substance is saturated in 100 g liquid(s) at 20° C. Further, both the viscosity and the surface tension in the present disclosure are measured at 30° C.

In the present disclosure, the immiscibility of the first liquid and the second liquid means that the first liquid and the second liquid can be clearly layered after being mixed in a certain ratio within a certain temperature range. The boiling point in the present disclosure is measured under normal atmospheric pressure. The density in the present disclosure generally refers to average density, which may be the density of a single substance or the average density of mixed substances.

As mentioned in the section of background art, in the prior art, when the solution method is used for film formation, the problem of uneven film layer easily occurs. In order to improve the state of the art, the embodiments disclosed herein relate to an ink formulation which includes a component A and a component B, the component A including a first liquid, the component B including a second liquid and a functional material dispersed in the second liquid, the first liquid having a boiling point at least 10° C. higher than a boiling point of the second liquid; the first liquid and the second liquid are immiscible, the solubility of the functional material in the second liquid is more than or equal to 1 g, the solubility of the functional material in the first liquid is less than or equal to 0.05 g, the density of the first liquid is greater than the density of the second liquid, and the ratio of the surface tension of the first liquid to the surface tension of the second liquid is 0.8 to 1.2.

In the aforesaid ink formulation of the present application, two different components are formed by two mutually immiscible liquids, and by making the boiling point of the first liquid, in which the functional material has a lower solubility, at least 10° C. higher than the boiling point of the second liquid capable of dissolving the functional material, due to the low boiling point of the second liquid, the volatilization of the second liquid is earlier than the first liquid, a first interface is formed between the component B and the external atmosphere, and a second interface is formed between the component B and the component A due to the immiscibility of the first liquid and the second liquid, during the film formation of the ink formulation. The first interface and the second interface may be not only planar but also curved. Since the surface tension of the first liquid and the surface tension of the second liquid are relatively close, the first interface and the second interface are nearly parallel or completely parallel. Here, "parallel" means that the distances of all points on the first interface from the second interface are equal in the gravity direction. As the second liquid volatilizes, the functional material in the second liquid gradually precipitates and settles, and is homogenously distributed at the second interface. Since the solubility of the settled functional material in the first liquid is extremely low, it is difficult for the first liquid to drive the functional material to the edge during the volatilization process, and then, with the gradual evaporation of the first liquid, the functional material uniformly dispersed at the interface forms a uniform film on the substrate, which solves the problem of uneven film formation.

Figure 1:
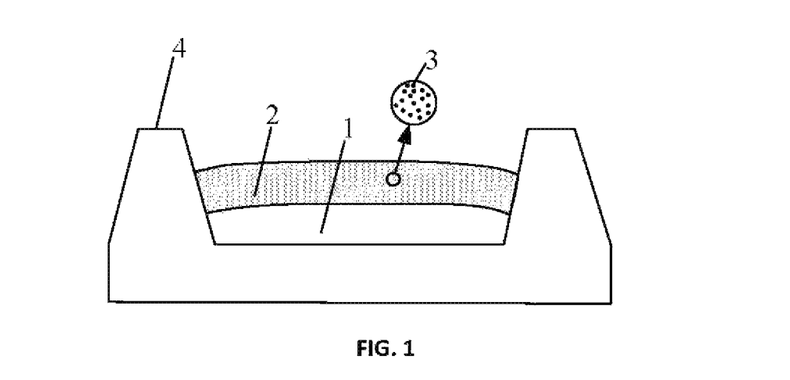
FIG. 1 shows a schematic view disclosing the state in which a first liquid and a second liquid in an ink are not volatilized during the process of preparing a film layer by using an optional ink formulation according to an embodiment of the present disclosure.
Figure 2:
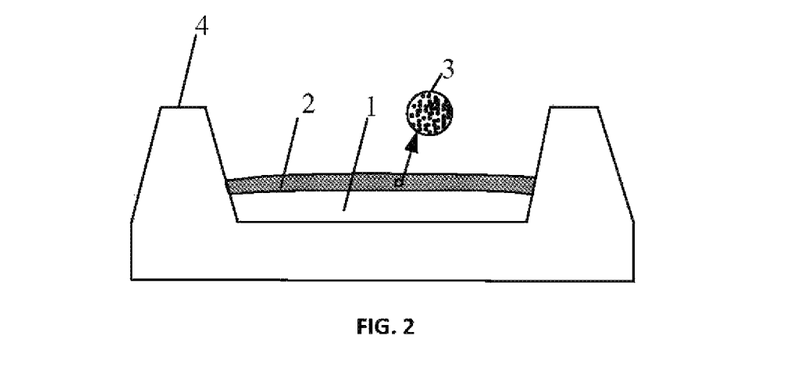
FIG. 2 shows a schematic view disclosing the state in which a second liquid is largely volatilized in an ink during the process of preparing a film layer by using an optional ink formulation according to an embodiment of the present disclosure.
Figure 3:
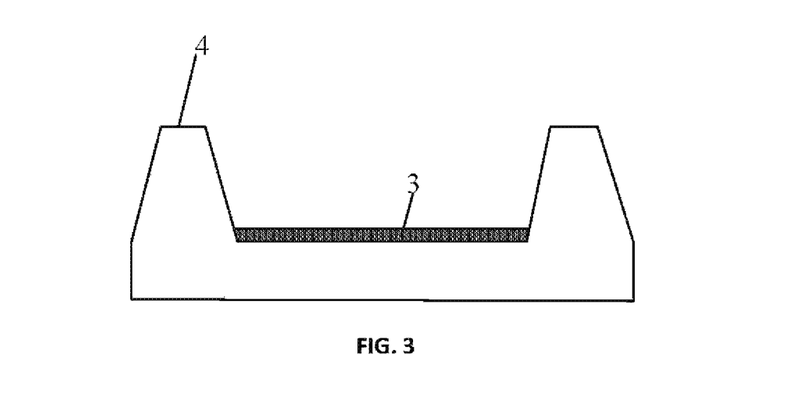
FIG. 3 shows a schematic view disclosing the state in which a first liquid and a second liquid in an ink are volatilized during the process of preparing a film layer by using an optional ink formulation according to an embodiment of the present disclosure.

As shown in FIGS. 1 to 3, in any of the pixel recess formed by the pixel isolation structure 4, during the wet film formation process in the pixel recess using the ink of the aforesaid ink formulation, since the first liquid 1 and the second liquid 2 in the ink are immiscible, and the density of the first liquid 1 is larger, the ink will be layered when disposed in the pixel recess to form two "parallel" interfaces, the first interface and the second interface, and as shown in FIG. 1, the first interface is an interface between the second liquid 2 and the upper atmosphere, and the second interface is an interface formed by the first liquid 1 and the second liquid 2; since the functional material 3 is more easily dissolved in the second liquid 2, as shown in FIG. 1, the majority of the functional material 3 is distributed in the second liquid 2, and a very small amount (negligible) is distributed in the first liquid 1; as shown in FIG. 2, since the boiling point of the second liquid 2 is lower, the second liquid 2 volatilizes earlier than the first liquid 1, and as the second liquid 2 volatilizes, the functional material 3 in the second liquid 2 gradually precipitates and settles, and is homogeneously distributed at the interface of the second liquid; as shown in FIG. 3, after the second liquid 2 is volatilized, the first liquid 1 is also volatilized largely, while the functional material 3 is rarely dissolved in the first liquid 1, resulting in no moving of the functional material 3 to the edge during the volatilization, so that after the first liquid 1 and the second liquid 2 are completely volatilized, the functional material 3 can be more evenly distributed at the bottom of the pixel recess formed by the pixel isolation structure 4, forming a film layer.

In some embodiments, the ratio of the surface tension of the first liquid to the surface tension of the second liquid is 0.9 to 1.1. The ratio of the surface tension of the first liquid to the surface tension of the second liquid is equal to 1. The closer the ratio of the surface tension of the first liquid to the surface tension of the second liquid to 1 is, the more approximately parallel the first interface and the second interface formed above are, the more favorable for even distribution of the functional material on the interface, thereby forming a uniform film. The more the ratio of the surface tension of the first liquid to the surface tension of the second liquid deviates from 1, the larger the distance difference of all points of the first interface from the second interface in the gravity direction is, and then, with the subsequent volatilization of the first liquid, there is also a content difference of functional materials that settle on the second interface.

In some embodiments, the functional material has a solubility in the second liquid of 2 g or more, and the functional material has a solubility in the first liquid of less than 0.01 g. The greater the difference in the solubility characteristic of the functional material in the two liquids, the more avoidable the effect of the first liquid on the distribution uniformity of the functional materials at the interface during the volatilization process, and the more uniform the film is formed.

In the aforesaid embodiment, the purpose of the boiling point of the first liquid being at least 10° C. higher than the boiling point of the second liquid is to make the second liquid which dissolves the functional material to volatilize earlier than the first liquid which is difficult to dissolve the functional material, and the difference in the boiling point between the two can lead to no change or slight change of the morphology of the second interface formed by the first liquid and the second liquid before the second liquid which dissolves the functional material is completely volatilized. In one or more embodiments, the first liquid has a boiling point at least 20° C. higher than a boiling point of the second liquid. In some embodiments, the first liquid has a boiling point at least 30° C. higher than a boiling point of the second liquid. The bigger difference between the boiling point of the first liquid and the boiling point of the second liquid is, and the greater probability that the morphology of the second interface remains unchanged before the second liquid is completely volatilized is.

The aforesaid ink formulation of the present disclosure is suitable for film formation of a variety of existing functional materials, including but not limited to electron injecting materials, electron transport materials, hole injection materials, hole transport materials, and luminescent materials. The main items listed here are the functional materials commonly used in the fabrication of optoelectronic devices.

In some embodiments, in the aforesaid ink formulation, the first liquid or the second liquid is selected from one or more of an aliphatic hydrocarbon, an aromatic hydrocarbons, a monohydric alcohol, a polyhydric alcohol, a ketone, an ester, an ether and water. The first liquid and the second liquid may be appropriately selected from the aforesaid components depending on the type of the functional material, as long as the aforesaid conditions of boiling point, density and mutual immiscibility are satisfied. The aforesaid first liquid or second liquid may be a single type of solvent, or may include a plurality of types of solvents. When the first liquid or the second liquid includes a combination of a plurality of solvents, the boiling point of the first liquid generally refers to the boiling point of the entire solvent composition in the first liquid, and likewise, the boiling point of the second liquid also refers to the boiling point of the whole liquid after mixing.

In some embodiments, the aforesaid aliphatic hydrocarbons include, but are not limited to, n-hexane, n-heptane, n-octane, n-nonane, n-decane, undecane, dodecane, tridecane, tetradecane, pentadecane, hexadecane, cyclohexane, cycloheptane, cyclooctane, cyclodecane, etc., cycloundecane, and isomers thereof.

In some embodiments, the aforesaid aromatic hydrocarbons include, but are not limited to, ethylbenzene, o-xylene, m-xylene, p-xylene, o-chlorotoluene, p-chlorotoluene, m-chlorotoluene, o-diethylbenzene, m-diethylbenzene, p-diethylbenzene, o-dichlorobenzene, m-dichlorobenzene, p-dichlorobenzene, trimethylbenzene, tetramethylbenzene, tripentylbenzene, phenyl cyclohexane, pentyl toluene, 1-methylnaphthalene, dihexylbenzene, n-butylbenzene, sec-butylbenzene, tert-butylbenzene, isobutylbenzene, dibutylbenzene, cumene, p-methyl cumene, p-diisopropylbenzene, pentylbenzene, dipentylbenzene, dodecylbenzene, tetrahydronaphthalene, cyclohexylbenzene, 1,3,5-trimethylphenyl cyclohexylbenzene, 1-chloronaphthalene, 1-tetralone, 3-phenoxytoluene, 1-methoxynaphthalene, dimethylnaphthalene, 3-isopropyl biphenyl, 1,2,4-trimethyl phenyl biphenyl, benzyl benzoate, dibenzyl ether, indene, benzylbenzene, divinylbenzene, indane, styrene oxide, and the like, or any mixture thereof.

In some embodiments, the aforesaid monohydric alcohols may include, but are not limited to, ethanol, methanol, butanol, propanol, isopropanol, butanol, isobutanol, pentanol, hexanol, heptanol, octanol, nonanol, decanol, undecanol, dodecanol and isomers thereof.

In one or more embodiments, the polyhydric alcohols are, but are not limited to, propanediol, ethanediol, diethylene glycol, dipropylene glycol, 1,2-butanediol, 1,3-butanediol, 1,4-butanediol, hexanediol, pentanediol, 3-methyl-1,5-pentanediol, glycerol, 2-butene-1,4-diol; these solvents may be used alone or in combination of two or more.

In some embodiments, the ketones may include, but are not limited to, butanone, 2-pentanone, 3-pentanone, 2-hexanone, 3-hexanone, butanedione, acetylacetone, cyclohexanone and 2,5-hexanedione.

In some embodiments, the esters may include, but are not limited to, ethyl 3-ethoxypropionate, propylene glycol methyl ether acetate, dimethyl ortho-phthalate, propylene glycol carbonate and octyl acetate.

In some embodiments, the ethers include, but are not limited to, his (2-methoxyethyl) ether, o-nitroanisole, diphenyl ether, dibenzyl ether, Us (2-chloroethyl) ether, m-dimethoxy benzene and benzyl benzoate.

In some embodiments, the alcohol ethers include, but are not limited to, one or more of ethylene glycol monoalkyl ether, propylene glycol monoalkyl ether, and polyethylene glycol monoalkyl ether. For example, aforesaid organic solvent of small molecular ether may be ethylene glycol monomethyl ether, ethylene glycol monoethyl ether, ethylene glycol monobutyl ether, ethylene glycol mono-tert-butyl ether, ethylene glycol monobenzyl ether, ethylene glycol dibenzyl ether, propylene glycol n-propyl ether, propylene glycol butyl ether, diethylene glycol methyl ether, diethylene glycol dimethyl ether, diethylene glycol ethyl ether (diethylene glycol monoethyl ether, carbitol), diethylene glycol monoethyl ether, diethylene glycol diethyl ether, diethylene glycol butyl ether, diethylene glycol dibutyl ether (dibutyl carbitol), dipropylene glycol monomethyl ether, dipropylene glycol propyl ether, dipropylene glycol butyl ether, dipropylene glycol monomethyl ether, triethylene glycol ether, triethylene glycol dimethyl ether, tetraglycol dimethyl ether, tripropylene glycol monomethyl ether, tripropylene glycol propyl ether, tripropylene glycol butyl ether, polyethylene glycol monobutyl ether.

For different functional materials, there are different requirements for the content of the functional material after film formation in application. In some embodiments, the functional material has a solid content of 1 mg/mL to 200 mg/mL in the aforesaid ink formulation.

In one or more embodiments, the functional material is a luminescent material, the luminescent material being a luminescent nanocrystal, and the first liquid is selected from one or more of an alcohol and an ester. In some embodiments, the alcohol is a monohydric alcohol or a polyhydric alcohol having a carbon number of less than 18. In some embodiments, the alcohol is a monohydric alcohol having a carbon number of less than 18 and greater than or equal to 6 or a polyhydric alcohol having a carbon number of less than 18 and greater than or equal to 2. The selection of a particular alcohol or ester liquid can be reasonably adjusted depending on the particular material of the particular luminescent nanocrystal. The alcohol-based first liquid of monohydric alcohol or polyhydric alcohol having a carbon number of less than 18 has a relatively low freezing point, and is difficult to form a solid at room temperature, facilitating the wet process.

In some embodiments, the aforesaid monohydric alcohols having a carbon number of less than 18 and greater than 6 include, but are not limited to, hexanol, heptanol, octanol, nonanol, decanol, undecanol, dodecanol and isomers thereof, and the preferred polyhydric alcohols having a carbon number of less than 18 and greater than 2 include: propanediol, ethanediol, diethylene glycol, dipropylene glycol, 1,2-butanediol, 1,3-butanediol, 1,4-butanediol, hexanediol, pentanediol, 3-methyl-1,5-pentanediol, glycerol, 2-butene-1,4-diol.

In the above embodiments, the second liquid includes any one or more of an aliphatic hydrocarbon and/or an aromatic hydrocarbon, and the second liquid has a boiling point of 170 to 300° C.; in some embodiments, the second liquid is an aromatic hydrocarbon having a carbon number of 9 to 18 and/or an alkane having a carbon number of 10 to 18; in some embodiments, the second liquid is an aromatic hydrocarbon having a carbon number of 10 to 18. An aliphatic hydrocarbon or an aromatic hydrocarbon having a boiling point in the range of 170° C. to 300° C. is selected as the second liquid, which is suitable for various wet processes such as ink-jet printing, slit coating or spray coating, etc., in addition to the advantages of dissolving the luminescent nanocrystals and having a moderate volatilization rate.

In one or more embodiments, the aforesaid alkanes having a carbon number of 10 to 18 include n-decane, undecane, dodecane, tridecane, tetradecane, pentadecane, hexadecane and isomers thereof, and the aforesaid aromatic hydrocarbons having a carbon number of 9 to 18 include, but are not limited to, pentyl toluene, 1-methylnaphthalene, dihexylbenzene, n-butylbenzene, sec-butylbenzene, tert-butylbenzene, isobutylbenzene, dibutylbenzene, p-methyl cumene, p-diisopropylbenzene, pentylbenzene, dipentylbenzene, dodecylbenzene, tetrahydronaphthalene, cyclohexylbenzene, 1,3,5-trimethylphenyl cyclohexylbenzene, 1-chloronaphthalene, dimethylnaphthalene, 3-isopropyl biphenyl, 1,2,4-trimethyl phenyl biphenyl, benzylbenzene, indane, etc.

In some embodiments, when the first liquid and the second liquid satisfy the aforesaid performance requirements, the phenomenon of coffee ring occurring at the time of film formation of the luminescent nanocrystal can be avoided. In one or more embodiments, the second liquid further includes various functional regulators to adjust the viscosity and surface tension of the system, or to improve the dispersion of the luminescent material in the system. The functional regulator is selected from an alcohol, a ketone or an ester. In some embodiments, the volume percentage of the functional regulator in the second liquid is 10% to 50%. The addition of the aforesaid functional regulators to the second liquid helps to adjust the viscosity and surface tension of the system and control the overall volatilization rate. The amount of the functional regulator has a great influence on the film formation of the luminescent nanocrystal, therefore the volume in the range of 10% to 50% can better adjust the solid content of the luminescent nanocrystal in the second liquid, and simultaneously adjust the volatilization rate of the second liquid, be beneficial to inhibition of the formation of the coffee ring effect to some extent.

In some embodiments, the selection of alkanes and/or aromatic hydrocarbons having a carbon number of 10 to 18 as the second liquid in the ink formulation has advantages such as the capability of dissolving the luminescent nanocrystals by themselves and a moderate volatilization rate, and is suitable for carrying out various wet processes such as ink-jet printing, slit coating, and the like. In some embodiments, the volume percentage of the alkane in the second liquid is ≥30%. In some embodiments, the volume percentage of the alkane in the second liquid is ≥50%. The volume content of the alkane in the second liquid can be controlled within the aforesaid range because the alkane has a better capability of dissolving the luminescent nanocrystals as the main liquid.

In some embodiments, the component B is a component that dissolves the functional material, and for different functional materials, there is also a certain difference in the content thereof in the second liquid. In the aforesaid embodiments, the luminescent nanocrystal has a solid content of 20 mg/mL to 200 mg/mL in the component B. By controlling the solid content of the luminescent nanocrystals in the component B within the aforesaid range, a luminescent nanocrystal film layer having a wider thickness range can be obtained.

In some embodiments, the luminescent nanocrystal has a surface ligand, the surface ligand being selected from one or more of a carboxylic acid, an alkyl mercaptan, an amine, an alkyl phosphine and an alkylphosphine oxide. These surface ligands are more advantageous for dispersing luminescent nanocrystals in the corresponding liquids, which can increase the stability of the ink formulation.

In the aforesaid ink formulation of the present disclosure, the surface tension of the first liquid can be reasonably adjusted according to the surface energy of the film layer because the component A needs to be in contact with the film substrate in a subsequent process and can be laid flatly on the film substrate. In some embodiments, the component A has a surface tension of 30 to 45 dyn/cm.

Similarly, in the aforesaid ink formulation of the present application, the viscosity and surface tension of the second liquid can be reasonably adjusted based on the existing surface tension to meet different process requirements such as ink-jet printing, slit coating and spray coating. In one or more embodiments, the surface tension of the second liquid is adjusted to be close to or equal to the surface tension of the first liquid to obtain a film layer having a good thickness uniformity. In one or more embodiments, the surface tension of the second liquid is 25 to 40 dyn/cm. In the aforesaid ink formulation of the present application, the amounts of the component A and the component B can be appropriately adjusted depending on the type of the functional material and the wet film formation process. In one or more embodiments, the volume ratio of the component A to the component B is 1:1 to 10:1, and the amount of both components is controlled within the aforesaid range based on ensuring the existence of the first liquid when the second liquid is completely volatilized, and moreover, the amount of the component A can be slightly more than the component B due to earlier application than the component B, but considering the actual operability, it is not suitable to add too much.

In another aspect, there is provided a preparation method of functional layer of optoelectronic device, and the preparation method includes: disposing a component A as a first preliminary layer; disposing a component B on the first preliminary layer to form a second preliminary layer to obtain a preform; drying the preform to obtain the functional layer of optoelectronic device; in which, the component A and the component B are the component A and the component B in any one aforesaid ink formulation. The optoelectronic device may be an electroluminescent device or a solar cell, a photovoltaic cell. In one or more embodiments, the aforesaid drying treatment may be any drying treatment such as vacuum drying, infrared drying or oven drying, and the like, and is the way having no adverse effect on the functional layer during drying. The timing of the foregoing drying treatment may be after the preliminary layer of one functional layer is prepared, or after the preliminary layers of a plurality of functional layers are prepared.

In the preparation method of functional layer of optoelectronic device of the present application, since two mutually immiscible liquids are used, and the boiling point of the first liquid is at least 10° C. higher than the boiling point of the second liquid, by disposing the component A containing the first liquid as the first preliminary layer, and then disposing the component B containing the second liquid where the functional material is included on the first preliminary layer to form the second preliminary layer, this manner of disposing layers in batches is advantageous for inhibiting the formation of the coffee ring. Finally, the component A and the component B are dried to realize liquid volatilization, thereby obtaining the target functional layer of optoelectronic device. The target functional layers include, but is not limited to, electron injection layer, electron transport layer, hole injection layer, hole transport layer, and light-emitting layer.

In the aforesaid preparation method, two different components are formed by two mutually immiscible liquids, and by making the boiling point of the first liquid, in which the functional material has a lower solubility, at least 10° C. higher than the boiling point of the second liquid capable of dissolving the functional material, due to the low boiling point of the second liquid and the resulting earlier volatilization of the second liquid than the first liquid, a first interface is formed between the component B and the external atmosphere, and a second interface is formed between the component B and the component A due to the immiscibility of the first liquid and the second liquid, during the film formation of the ink formulation. The first interface and the second interface may be not only planar but also curved. Since the surface tension of the first liquid and the surface tension of the second liquid are relatively close, the first interface and the second interface are nearly parallel or completely parallel. As the second liquid volatilizes, the functional material in the second liquid gradually precipitates and settles, and is homogeneously distributed at the second interface. Since the solubility of the settled functional material in the first liquid is extremely low, it is difficult for the first liquid to drive the functional material to the edge during the volatilization process, and then, with the gradual evaporation of the first liquid, the functional material uniformly dispersed at the interface forms a uniform film on the substrate, which solves the problem of uneven film formation. In the aforesaid preparation method, the first preliminary layer and/or the second preliminary layer may be disposed by an existing disposing method. The manner of disposing in this disclosure includes, but is not limited to, ink-jet printing, slit coating, or spray coating.

In one or more embodiments, there is provided a method for preparing an optoelectronic device, and the preparation method of the optoelectronic device including preparation steps of functional layers, in which the preparation steps of functional layers include: disposing a component A as a first preliminary layer; disposing a component B on the first preliminary layer to form a second preliminary layer; disposing a component C on the second preliminary layer to form a third preliminary layer to obtain a preform; drying the preform to obtain two adjacent functional layers; in which, the first preliminary layer and the second preliminary layer subjected to drying form a functional layer, and the third preliminary layer subjected to drying forms another functional layer, the component A and the component B are the component A and the component B in any one aforesaid ink formulation; the liquid density in the component C is smaller than the liquid density in the component B; the liquid in the component C is immiscible with the liquid in the component B; the solubility of the functional material of the component C in the liquid of the component B is 0.05 g or less; and the ratio of the surface tension of the liquid in the component C to the surface tension of the liquid in the component B is 0.8 to 1.2. In some embodiments, the aforesaid ratio is 0.9 to 1.1. In another embodiment, the aforesaid ratio is 1.

In the aforesaid embodiment, by controlling the relationship between the ink formulations of the adjacent two functional layers, the disposing of ink for the next layer of the functional layer can be performed without waiting for the drying of the previous functional layer, so that the multiple functional layers can be continuously prepared, thereby increasing production efficiency. Of course, when the number of the functional layers in the optoelectronic device is greater than two, the ink formulation of the functional layer other than the foregoing adjacent two functional layers can be prepared by using an existing ink formulation, thus after each of other functional layers prepared, a drying treatment is required causing a relatively low production efficiency.

In some embodiments, there is provided a method for preparing another optoelectronic device including preparation steps of functional layers, and the preparation steps of functional layers include: disposing a component A1 as a first preliminary layer; disposing a component B1 on the first preliminary layer to form a second preliminary layer; disposing a component A2 on the second preliminary layer to form a third preliminary layer; the third preliminary layer is adjacent to the second preliminary layer; disposing a component B2 on the third preliminary layer to form a fourth preliminary layer to obtain the preform; drying the preform to obtain two functional layers; in which, the first preliminary layer and the second preliminary layer subjected to drying form a functional layer; the third preliminary layer and the fourth preliminary layer subjected to drying form another functional layer; the component A1 and the component B1 are the component A and the component B in any one aforesaid ink formulations; the component A2 and the component B2 are the component A and the component B in any one aforesaid ink formulations, and the liquid density in the component A2 is less than the liquid density in the component B1, and the liquid in the component A2 is immiscible with the liquid in the component B1; the solubility of the functional material of the component B1 in the liquid of the component A2 is 0.05 g or less; and the ratio of the surface tension of the liquid in the component A2 to the surface tension of the liquid in the component B1 is 0.8 to 1.2.

In the aforesaid embodiment, by controlling the relationship between the ink formulations of the adjacent two functional layers, the disposing of ink for the next layer of the functional layer can be performed without waiting for the drying of the previous functional layer, so that the multiple functional layers can be continuously prepared, thereby increasing production efficiency. Of course, when the number of the functional layers in the optoelectronic device is greater than two, the ink formulation of the functional layer other than the adjacent two functional layers can be prepared by using an existing ink formulation, thus after each of other functional layers prepared, a drying treatment is required causing a relatively low production efficiency.

It should be explained that, in the preparation of the optoelectronic device, it is necessary to dispose a plurality of functional material layers, and the component A can be disposed on the ready-made film layer substrate. However, the film layer substrate can be insoluble in the first liquid in the component A, otherwise the normal function of the film layer substrate will be affected, thereby affecting the performance of the optoelectronic device. It should be noted that the word "insoluble" here does not represent "absolutely insoluble", but means that the solubility is poor and does not affect the normal function of the film layer substrate.

In another aspect, there is also provided an optoelectronic device including a substrate and a first electrode layer and a second electrode layer sequentially disposed on the substrate, in which there is provided a functional layer between the first electrode layer and the second electrode layer, the functional layer being prepared by any one aforesaid preparation method. The optoelectronic device prepared by the aforesaid method has high luminous efficiency and uniform light emission because the functional layer does not have the phenomenon of coffee ring.

The substrate in the aforesaid optoelectronic device can be selected according to actual product requirements. In one or more embodiments, the optoelectronic device is an electroluminescent device, and the substrate is a conductive substrate having a pixel isolation structure. The pixel isolation structure defines a plurality of pixel regions, and each electroluminescent device is located in each respective pixel region. A conductive substrate having pixel isolation structures can restrict flowing of liquid, and luminescent materials having different luminescent ranges can be disposed in different pixel regions, thereby being applicable to colored display.

Advantageous effects of the present application will be further described below in conjunction with specific embodiments.

EMBODIMENTS

Embodiment 1-8

The functional materials in Embodiments 1-8 were all luminescent nanocrystals (red quantum dots, CdSe/ZnS with oleylamine ligand), and the types and amounts of the components in the ink formulations of the each embodiment are as follows.

TABLE 1

| Item | | Embodiment 1 | Embodiment 2 | Embodiment 3 | Embodiment 4 |
|---|---|---|---|---|---|
| Component A | Type | Dimethylortho-phthalate | Propylene glycol carbonate | 2-methyl-1,4-pentanediol | Ethylene glycol |
| | Boiling point/°C. | 282 | 242 | 197 | 197.3 |
| | Surface tension/dyn/cm | 38.5 | 30 | 30.8 | 43.4 |
| Component B | Type | Tetradecane | Dodecane | Decane | Decane |
| | Alkane volume content % | 50% | 60% | 90% | 30% |
| | Boiling point/°C. | 254 | 216.3 | 174.2 | 174.2 |
| | Surface tension/dyn/cm | 34.2 | 27.7 | 25.6 | 40 |
| | Type and volume content of functional regulators/% | m-methylcyclohexanol; 50% | Decanol; 40% | Octyl acetate; 10% | m-methylcyclohexanol, 70% |
| | Solid content/mg/mL | 80 | 20 | 80 | 120 |
| Volume of component A:volume of component B | | 1:1 | 10:1 | 5:1 | 3:1 |

| Item | | Embodiment 5 | Embodiment 6 | Embodiment 7 | Embodiment 8 |
|---|---|---|---|---|---|
| Component A | Type | 2-butene-1,4-diol | Ethylene glycol | Dimethyl ortho-phthalate | Dimethyl ortho-phthalate |
| | Boiling point/°C. | 235 | 197.3 | 282 | 171 |
| | Surface tension/dyn/cm | 40 | 43.4 | 38.5 | 27.4 |
| Component B | Type | Dodecane | N-butylbenzene | Dodecane | Octane |
| | Alkane volume content % | 30% | 30% | 50% | 100% |
| | Boiling point/°C. | 216.3 | 183.1 | 216.3 | 125.8 |
| | Surface tension/dyn/cm | 38 | 40.1 | 32 | 23 |
| | Type and volume content of functional regulators/% | m-dimethoxybenzene; 70% | Nitrobenzene; 70% | Phenylcyclohexane; 50% | / |
| | Solid content/mg/mL | 80 | 200 | 90 | 100 |
| Volume of component A:volume of component B | | 1.5:1 | 8:1 | 5:1 | 6:1 |

The ink formulation of each of the aforesaid embodiments was ink-jet printed (printer model DMP2831) on a transparent glass substrate, and the film thickness was measured using a Filmetrics F40 model machine. Nine points were uniformly tested, and then the thickness uniformity=(Max−Min)/(2Ave) was, calculated, and Ave=(d1+d2+d3+ . . . +d8+d9)/9, where Max was the largest thickness value of the 9 values, Min was the smallest thickness value, Ave meant the average thickness of all points, and d1, d2, d9 represented the thickness value of each point. The smaller the value of the thickness uniformity was, the more uniform of the film thickness became. The results of the thickness uniformity of each of embodiments are shown in Table 2.

TABLE 2

| Designation | Thickness uniformity % |
|---|---|
| Embodiment 1 | 10.2 |
| Embodiment 2 | 13.7 |
| Embodiment 3 | 15.0 |
| Embodiment 4 | 12.2 |
| Embodiment 5 | 12.6 |
| Embodiment 6 | 18.4 |

TABLE 2-continued

| Designation | Thickness uniformity % |
|---|---|
| Embodiment 7 | 10.5 |
| Embodiment 8 | 14.7 |
| Comparative Embodiment1 | 23.5 |

The ink formulation of each of the aforesaid embodiments is used to prepare the luminescent layer by the following method, and the preparation method of quantum dot layer is taken as an example to describe the preparation method of the functional material layer of the present application:

On a substrate having pixel isolation structures and an anode layer, a hole injection layer is first fabricated by ink-jet printing method using an aqueous solution of Poly (3,4-ethylenedioxythiophene):poly(styrene sulfonate) (PEDOT:PSS) and subjected to vacuum drying; a hole transport layer is fabricated on the hole injection layer by ink-jet printing using a toluene solution of poly(9-vinyl)carbazole (PVK) and subjected to vacuum drying; the component A is disposed on the hole transport layer by ink-jet printing to form a first preliminary layer; the component B is disposed on the first preliminary layer by ink-jet printing to form a second preliminary layer and subjected to vacuum drying to obtain a quantum dot luminescent layer of electroluminescent device; an electron transport layer was fabricated on the quantum dot luminescent layer by ink-jet printing method using a butanol solution of zinc oxide nanocrystals and subjected to vacuum drying; finally, silver was vacuum-deposited on the electron transport layer to form a cathode.

Comparative Embodiment 1

The quantum dot ink used for the comparative embodiment was prepared by method of CN105820663A. The preparation method was as follows: A mixture of 10 wt % of red CdSe/ZnS quantum dots with oleylamine ligand, 54 wt % 3,3,5-trimethylheptane liquid and 36 wt % 2-methylpentanol liquid was stirred for 30 minutes to obtain a quantum dot ink. A quantum dot luminescent layer was prepared in accordance with one-time ink-jet printing.

Other functional layers have the same structures, and were prepared according to the preparation method of the embodiment. The quantum dot luminescent layer prepared by the aforesaid embodiment was used to prepare an electroluminescent device, and the luminescence uniformity of the electroluminescent devices of the respective Embodiments 1-8 and Comparative Embodiment 1 was tested. The test methods and results are as follows:

The brightness of the 21 points (unit: $Cd/m^2$) averagely distributed in the luminescent device in the test embodiment was measured using a PR670 spectrophotometer/colorimeter/radiometer manufactured by PHOTO RESEARCH, at a current density of 2 $mA/cm^2$. And the brightness uniformity=(Max-Min)/(2Ave) was calculated, and Ave=(L1+L2+L3+ . . . +L20+L21)/21, where Max was the largest brightness value of the 21 values, Min was the smallest brightness value, Ave meant the average brightness of all points, and L1, L2, . . . , L21 represented the brightness value of each point. The smaller the value of the brightness uniformity was, the more uniform of the light emission became, and the better the thickness uniformity of the film layer became. The test results are shown in Table 3 below.

TABLE 3

| Designation | Brightness uniformity % |
|---|---|
| Embodiment 1 | 26.8% |
| Embodiment 2 | 30.5% |
| Embodiment 3 | 32.4% |
| Embodiment 4 | 27.6% |
| Embodiment 5 | 28.1% |
| Embodiment 6 | 38.5% |
| Embodiment 7 | 27.7% |
| Embodiment 8 | 31.3% |
| Comparative Embodiment1 | 45.0% |

It can be seen that the quantum dot luminescent layers were prepared by using the ink formulation of the quantum dot luminescent layer in the aforesaid Embodiments 1 to 8, since the coffee ring phenomenon is greatly reduced, the brightness uniformity was reduced by 6.5% to 18.2% compared with Comparative Embodiment 1, thereby improving the uniformity of luminescence.

From the above description, it can be seen that the aforesaid embodiments of the present disclosure achieve the following technical effects: in the ink formulation and the preparation method of the present application, two different components are formed by two mutually immiscible liquids, and by making the boiling point of the first liquid where the functional material has a lower solubility being at least 10° C. higher than the boiling point of the second liquid capable of dissolving the functional material, due to the low boiling point of the second liquid and the resulting earlier volatilization of the second liquid than the first liquid, a first interface is formed between the component B and the external atmosphere and a second interface is formed between the component B and the component A, during the film formation of the ink formulation. Since the surface tension of the first liquid and the surface tension of the second liquid are relatively close, the first interface and the second interface are nearly parallel or completely parallel. As the second liquid volatilizes, the functional material in the second liquid gradually precipitates and settles, and is homogeneously distributed at the second interface. Since the solubility of the settled functional material in the first liquid is extremely low, it is difficult for the first liquid to drive the functional material to the edge during the volatilization process, and then, with the gradual evaporation of the first liquid, the functional material uniformly dispersed at the interface forms a uniform film on the substrate, which solves the problem of uneven film formation.

The foregoing descriptions are merely preferred embodiments of the present disclosure and are not intended to limit the present disclosure, and for those skilled in the art, the present disclosure may have various changes and modifications. Any modification, equivalent replacement, and improvement made in the spirit and principle of the present disclosure shall fall within the protection scope of the present disclosure.

What is claimed is:

1. A preparation method of a functional layer of optoelectronic device, wherein said preparation method comprises:
    disposing a component A as a first preliminary layer;
    disposing a component B on said first preliminary layer to form a second preliminary layer to obtain a preform;
    drying said preform to obtain said functional layer of optoelectronic device;
    wherein said component A comprising a first liquid, said component B comprising a second liquid and a functional material dispersed in said second liquid, said first liquid having a boiling point at least 10° C. higher than a boiling point of said second liquid; said first liquid and said second liquid are immiscible, the solubility of said functional material in said second liquid is more than or equal to 1 g, the solubility of said functional material in said first liquid is less than or equal to 0.05 g, the density of said first liquid is greater than the density of said second liquid, and the ratio of the surface tension of said first liquid to the surface tension of said second liquid is 0.8 to 1.2.

2. The preparation method of claim 1, wherein said first preliminary layer and/or said second preliminary layer are disposed in a manner of ink jet printing, slit coating or spray coating.

3. The preparation method of claim 1, wherein the ratio of the surface tension of said first liquid to the surface tension of said second liquid is 0.9 to 1.1.

4. The preparation method of claim 1, wherein said functional material has a solubility in said second liquid of 2 g or more, and said functional material has a solubility in said first liquid of less than 0.01 g.

5. The preparation method of claim 1, wherein said first liquid has a boiling point, at least 20° C. higher than said second liquid.

6. The preparation method of claim 1, wherein said functional material is selected from any one of an electron injection material, an electron transport material, a hole injection material, a hole transport material and a luminescent material.

7. The preparation method of claim 1, wherein said first liquid or said second liquid is selected from one or more of the group consisting of an aliphatic hydrocarbon, an aromatic hydrocarbons, a monohydric alcohol, a polyhydric alcohol, a ketone, an ester, an ether, an alcohol ether and water.

8. The preparation method of claim 1, wherein, in said component B, said functional material has a solid content of 1 mg/mL to 200 mg/mL.

9. The preparation method of claim 1, wherein said functional material is a luminescent material, said luminescent material being a luminescent nanocrystal, and said first liquid is selected from one or more of an alcohol and an ester.

10. The preparation method of claim 9, wherein said second liquid comprises any one or more of an aliphatic hydrocarbon and/or an aromatic hydrocarbon, and said second liquid has a boiling point of 170 to 300° C.

11. The preparation method of claim 10, wherein said second liquid further comprises a function regulator, said functional regulator being selected from an alcohol, a ketone or an ester.

12. The preparation method of claim 10, wherein said second liquid comprises an aromatic hydrocarbon having a carbon number of 9 to 18 and/or an alkane having a carbon number of 10 to 18, and the volume percentage of said alkane in said second liquid is ≥30%.

13. The preparation method of claim 9, wherein, in said component B, said luminescent nanocrystal has a solid content of 20 mg/mL to 200 mg/mL.

14. The preparation method of claim 9, wherein said luminescent nanocrystal has a surface ligand, said surface ligand being selected from one or more of the group consisting of a carboxylic acid, an alkyl mercaptan, an amine, an alkyl phosphine and an alkylphosphine oxide.

15. The preparation method of claim 1, wherein said component A has a surface tension of 30 to 45 dyn/cm.

16. The preparation method of claim 1, wherein said component B has a surface tension of 25 to 40 dyn/cm.

17. The preparation method of claim 1, wherein the volume ratio of said component A to said component B is 1:1 to 10:1.

18. A preparation method of optoelectronic device, said preparation method of optoelectronic device comprising preparation steps of functional layer, wherein said preparation steps of functional layer comprises:
 disposing a component A as a first preliminary layer;
 disposing a component B on said first preliminary layer to form a second preliminary layer;
 disposing a component C on said second preliminary layer to form a third preliminary layer to obtain a preform;
 drying said preform to obtain two adjacent functional layers;
 wherein, said first preliminary layer and said second preliminary layer subjected to drying form a functional layer, and said third preliminary layer subjected to drying forms another functional layer,
 said component A comprising a first liquid, said component B comprising a second liquid and a functional material dispersed in said second liquid, said first liquid having a boiling point at least 10° C. higher than a boiling point of said second liquid; said first liquid and said second liquid are immiscible, the solubility of said functional material in said second liquid is more than or equal to 1 g, the solubility of said functional material in said first liquid is less than or equal to 0.05 g, the density of said first liquid is greater than the density of said second liquid, and the ratio of the surface tension of said first liquid to the surface tension of said second liquid is 0.8 to 1.2; the liquid density in said component C is smaller than the liquid density in said component B; the liquid in said component C is immiscible with the liquid in said component B; the solubility of the functional material of said component C in the liquid of said component B is 0.05 g or less; and the ratio of the surface tension of the liquid in said component C to the surface tension of the liquid in said component B is 0.8 to 1.2.

19. A preparation method of optoelectronic device, said preparation method of optoelectronic device comprising a preparation step of functional layer, wherein said preparation step of functional layer comprises:
 disposing a component A1 as a first preliminary layer;
 disposing a component B1 on said first preliminary layer to form a second preliminary layer;
 disposing a component A2 on said second preliminary layer to form a third preliminary layer;
 said third preliminary layer is adjacent to said second preliminary layer;
 disposing a component B2 on the third preliminary layer to form a fourth preliminary layer to obtain said preform;
 drying said preform to obtain two functional layers;
 wherein, said first preliminary layer and said second preliminary layer subjected to drying form a functional layer; said third preliminary layer and said fourth preliminary layer subjected to drying form another functional layer; said component A1 comprising a first liquid, said component B1 comprising a second liquid and a functional material dispersed in said second liquid, said first liquid having a boiling point at least 10° C. higher than a boiling point of said second liquid; said first liquid and said second liquid are immiscible, the solubility of said functional material in said second liquid is more than or equal to 1 g, the solubility of said functional material in said first liquid is less than or equal to 0.05 g, the density of said first liquid is greater than the density of said second liquid, and the ratio of the surface tension of said first liquid to the surface tension of said second liquid is 0.8 to 1.2; said component A2 comprising a first liquid, said component B2 comprising a second liquid and a functional material dispersed in said second liquid, said first liquid having a boiling point at least 10° C. higher than a boiling point of said second liquid; said first liquid and said second liquid are immiscible, the solubility of said functional material in said second liquid is more than or equal to 1 g, the solubility of said functional material in said first liquid is less than or equal to 0.05 g, the density of said first liquid is greater than the density of said second liquid, and the ratio of the surface tension of said first liquid to the surface tension of said second liquid is 0.8 to 1.2, and the liquid density in said component A2 is less than the liquid density in said component B1, and the liquid in said component A2 is immiscible with the liquid in said component B1; the solubility of the functional material of said component B1 in the liquid of said component A2 is 0.05 g or less; and the ratio of the surface tension of the liquid in said component A2 to the surface tension of the liquid in said component B1 is 0.8 to 1.2.

* * * * *